(12) United States Patent
Caffee et al.

(10) Patent No.: US 9,634,678 B1
(45) Date of Patent: Apr. 25, 2017

(54) FEEDBACK CONTROL SYSTEM WITH RISING AND FALLING EDGE DETECTION AND CORRECTION

(71) Applicant: Silicon Laboratories Inc., Austin, TX (US)

(72) Inventors: Aaron J. Caffee, Scappoose, OR (US); Brian G. Drost, Corvallis, OR (US); Vaibhav Karkare, San Jose, CA (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 15/052,985

(22) Filed: Feb. 25, 2016

(51) Int. Cl.
| | | |
|---|---|---|
| *H03L 7/06* | (2006.01) | |
| *H03L 7/187* | (2006.01) | |
| *H03L 7/087* | (2006.01) | |
| *H03L 7/089* | (2006.01) | |
| *H03L 7/093* | (2006.01) | |
| *H03L 7/091* | (2006.01) | |

(52) U.S. Cl.
CPC .............. *H03L 7/187* (2013.01); *H03L 7/087* (2013.01); *H03L 7/0891* (2013.01); *H03L 7/091* (2013.01); *H03L 7/093* (2013.01)

(58) Field of Classification Search
USPC .................................. 327/147–149, 156–158
See application file for complete search history.

(56) References Cited

U.S. PATENT DOCUMENTS

| | | | |
|---|---|---|---|
| 7,545,190 B2 | 6/2009 | Chiang et al. | |
| 2002/0097826 A1* | 7/2002 | Iwata | H03L 7/0807 375/376 |
| 2007/0090866 A1 | 4/2007 | Park et al. | |
| 2008/0061850 A1* | 3/2008 | Watanabe | H03L 7/0893 327/157 |
| 2010/0061499 A1 | 3/2010 | Mijuskovic | |
| 2010/0264963 A1* | 10/2010 | Kikuchi | H03K 5/131 327/157 |
| 2011/0074479 A1 | 3/2011 | Yun et al. | |

(Continued)

OTHER PUBLICATIONS

Inti, R. et al., "A 0.5-to-2.5 Gb/s Reference-Less Half-Rate Digital CDR with Unlimited Frequency Acquisition Range and Improved Input Duty-Cycle Error Tolerance," IEEE Journal of Solid-State Circuits, vol. 46, No. 12, Dec. 2011, pp. 3150-3162.

(Continued)

*Primary Examiner* — Adam Houston
(74) *Attorney, Agent, or Firm* — Zagorin Cave LLP

(57) ABSTRACT

A technique for reducing noise in an output clock signal of a feedback control system (e.g., a PLL or FLL) samples rising edge errors and falling edge errors between a reference clock signal and a feedback clock signal. The technique applies edge alignment correction to reduce or eliminate edge alignment errors between the reference clock signal and the feedback clock signal. A PLL generates an output clock signal based on a control signal generated using an error signal generated based on a rising edge difference between a rising edge of an input clock signal and a corresponding edge of an edge alignment corrected feedback clock signal and based on a falling edge difference between a falling edge of the input clock signal and a corresponding edge of the edge alignment corrected feedback clock signal. The edge alignment corrected feedback clock signal is partially based on the output clock signal.

20 Claims, 9 Drawing Sheets

(56) References Cited

U.S. PATENT DOCUMENTS

| | | | |
|---|---|---|---|
| 2011/0109354 A1 | 5/2011 | Feng et al. | |
| 2011/0204948 A1 | 8/2011 | Satoh et al. | |
| 2011/0234272 A1* | 9/2011 | Yu | H03L 7/089 |
| | | | 327/157 |
| 2012/0153999 A1* | 6/2012 | Kim | H03L 7/0816 |
| | | | 327/157 |
| 2014/0268936 A1* | 9/2014 | Lu | H02M 1/36 |
| | | | 363/49 |

OTHER PUBLICATIONS

IDT, "I2C Programmable Ethernet Clock Generator," 8T49N4811 Data Sheet, Revision A, Mar. 30, 2015, pp. 1-34.
Ma, S., "Feasibility Study of Frequency Doubling Using an AN XOR-Gate Method," MSc. Thesis, Jan. 2013, pp. 1-77.
Oortgiesen, R., "Feasibility Study of Frequency Doubling using a Dual-Edge Method," MSc. Thesis, Nov. 2010, pp. 1-56.
Wikipedia, "Phase-locked loop," https://en.wikipedia.org/wiki/Phase-locked_loop, downloaded Dec. 14, 2015, 17 pages.
Razavi, Behzad, "RF Microelectronics," Second Edition, Prentice Hall, 2012, pp. 664-667.

* cited by examiner

FEEDBACK CONTROL SYSTEM WITH RISING AND FALLING EDGE DETECTION AND CORRECTION

BACKGROUND

Field of the Invention

This invention relates to generating clock signals for electronic devices.

Description of the Related Art

In general, clock synthesizers generate clock signals utilized by a wide variety of electronic products. A typical clock synthesizer utilizes a feedback control system (e.g., a phase-locked loop or a frequency-locked loop) supplied with a fixed frequency reference clock signal by a source such as a crystal oscillator. Although large loop bandwidths suppress more voltage-controlled oscillator noise than lower loop bandwidths and may support higher data rates, loop stability requirements limit maximum loop bandwidth to a fraction of the reference clock frequency FREF (e.g., 0.1×FREF). In addition, conventional phase-locked loops track edge alignment variations of reference clock signals and feedback clock signals thereby further degrading noise performance. Accordingly, improved techniques for reducing or eliminating noise in phase-locked loops and frequency-locked loops are desired.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

SUMMARY OF EMBODIMENTS OF THE INVENTION

Figure 1:
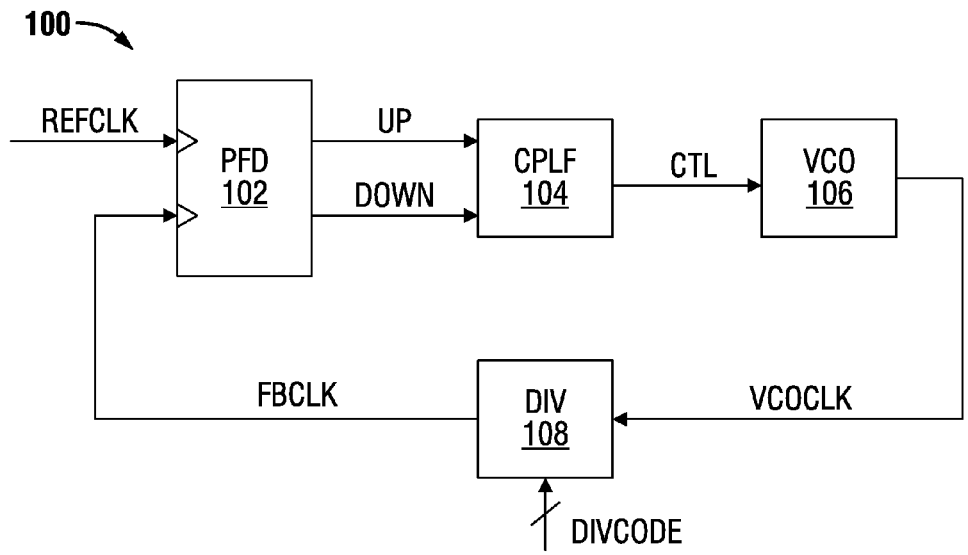
FIG. 1 illustrates a functional block diagram of a conventional analog phase-locked loop including a feedback frequency divider.

A technique for reducing noise in an output clock signal of a feedback control system samples rising edge errors and falling edge errors between a reference clock signal and a feedback clock signal. The technique applies edge alignment correction to reduce or eliminate relative edge alignment error between an edge of the reference clock signal and a corresponding edge of the feedback clock signal. In at least one embodiment of the invention, a feedback control system includes a controllable oscillator configured to generate an output clock signal based on at least one control signal generated using at least one error signal. The feedback control system includes an error detector configured to generate the at least one error signal based on a rising edge difference between a rising edge of an input clock signal and a first corresponding edge of an edge alignment corrected feedback clock signal. The at least one error signal is generated further based on a falling edge difference between a falling edge of the input clock signal and a second corresponding edge of the edge alignment corrected feedback clock signal. The edge alignment corrected feedback clock signal is at least partially based on the output clock signal.

The feedback control system may be a phase-locked loop. The feedback control system may include a feedback frequency divider circuit configured to generate the edge alignment corrected feedback clock signal based on the output clock signal, a divider code, and an edge alignment correction signal. The divider code may be used to provide a coarse edge alignment correction and the edge alignment correction signal may be used to provide a fine edge alignment correction. The phase locked-loop may include at least one loop filter configured to generate the edge alignment correction signal based on the at least one error signal.

The feedback frequency divider circuit may include a first divider circuit responsive to a selected divider code. The feedback frequency divider circuit may include a second divider circuit cascaded with the first divider circuit. The second divider circuit may be configured to divide a clock period by two. One of the first and second divider circuits may be configured to receive the output clock signal and the other of the first and second divider circuits being configured to provide a divided clock signal. The feedback frequency divider circuit may include a controllable delay line responsive to the edge alignment correction signal and the divided clock signal to generate the edge alignment corrected feedback clock signal.

The error detector may include a first phase and frequency detector configured to generate a first control signal of the at least one control signal based on the rising edge difference. The error detector may include a second phase and frequency detector configured to generate a second control signal of the at least one control signal based on the falling edge difference. The feedback control system may include a first charge pump configured to generate a first current indicative of the rising edge difference and a second charge pump configured to generate a second current indicative of the falling edge difference. The feedback control system may include a first loop filter configured to generate the first control signal based on the first current and a second loop filter configured to generate the second control signal based on the second current. The controllable oscillator may generate the output clock signal based on the first and second control signals. The feedback control system may include a difference circuit configured to generate the edge alignment correction signal based on a difference between the first control signal and the second control signal.

The feedback control system may be a digital frequency-locked loop. The feedback control system may include a notch filter configured to attenuate a reference tone in the at least one error signal and may include a loop filter configured to generate the at least one control signal based on an output of the notch filter. The error detector may include a time-to-digital converter configured to generate a digital phase error code as the at least one error signal.

In at least one embodiment of the invention, a method includes sampling rising edge input error between a rising edge of a reference clock signal and a first corresponding edge of an edge alignment corrected feedback clock signal. The method includes sampling falling edge input error between a falling edge of the reference clock signal and a second corresponding edge of the edge alignment corrected feedback clock signal. The method includes generating the edge alignment corrected feedback clock signal based on the rising edge input error, the falling edge input error, and a digital code. Generating the edge alignment corrected feedback clock signal may include averaging the rising edge input error and the falling edge input error to thereby reduce amplitude noise in the edge alignment corrected feedback clock signal. Generating the edge alignment corrected feedback clock signal may include generating a digital phase error code indicative of the rising edge input error and the falling edge input error. Generating the edge alignment corrected feedback clock signal may include notch filtering the digital phase error code to generate an edge alignment corrected phase error code. Generating the edge alignment corrected feedback clock signal may include generating a control signal based on the edge alignment corrected phase error code. The method may include generating the output clock signal using the control signal and providing the output clock signal as the edge alignment corrected feedback clock signal. Generating the edge alignment corrected feedback clock signal may include generating at least one error signal based on the rising edge input error and the falling edge input error. Generating the edge alignment corrected feedback clock signal may include generating the edge alignment correction signal based on the at least one error signal. Generating the edge alignment corrected feedback clock signal may include generating a divided output clock signal based on the output clock signal and a divider value. Generating the edge alignment corrected feedback clock signal may include delaying the divided output clock signal according to an edge alignment correction signal to generate the edge alignment corrected feedback clock signal. The divider value may be used to provide a coarse edge alignment correction and the edge alignment correction signal may be used to provide a fine edge alignment correction. Generating the divided output clock signal may include dividing a period of the output clock signal by the predetermined divider value and by an additional factor of two.

DETAILED DESCRIPTION

Referring to FIG. 1, an exemplary clock synthesizer utilizes analog phase-locked loop 100, which includes phase/frequency detector 102, charge pump loop filter 104, and voltage-controlled oscillator (VCO) 106. Voltage-controlled oscillator 106 may be implemented as a ring oscillator, an LC oscillator, or other suitable oscillator structure. Phase/frequency detector 102 receives reference clock signal REFCLK, which may be provided by a fixed source, such as a crystal oscillator, a microelectromechanical structure (MEMS) oscillator, or other suitable source, and generates error signals UP and DOWN based thereon. Charge pump loop filter 104 filters the error signals and provides control signal CTL to voltage-controlled oscillator 106 to adjust the frequency and phase of output clock signal VCOCLK to achieve phase lock to input clock signal REFCLK.

Feedback frequency divider 108 divides a frequency of the output clock signal VCOCLK according to the divider value DIVCODE. Reference clock signal REFCLK has frequency FREF that is multiplied based on divider value DIVCODE to generate output clock signal VCOCLK. Output clock signal VCOCLK has a frequency FVCO, and the frequency of output clock signal VCOCLK may be further modified based on another frequency divider (not shown) which may be an integer clock frequency divider including a digital-to-time period converter that generates a synthesizer output clock signal based on output clock signal VCOCLK as its reference clock signal and integer divide value DOUT to generate an output clock signal. The output frequency FVCO of output clock signal VCOCLK may be determined by divider value DIVCODE of the feedback frequency divider in the phase-locked loop: FVCO=FREF×DIVCODE.

Feedback frequency divider 108 may include a digital-to-time period converter that may be a fractional-N feedback frequency divider receiving output clock signal VCOCLK as its reference clock signal and divider value DIVCODE as a digital control word. Divider value DIVCODE may be a divide value sequence of integers corresponding to a target fractional divider ratio. In some embodiments of a phase-locked loop, divider value DIVCODE is an integer divider value. In some embodiments of phase-locked loop 100, feedback frequency divider 108 is excluded and a frequency multiplier circuit responsive to a multiplier code is used instead. In applications in which DIVCODE varies over time, feedback frequency divider 108 introduces a digital quantization error that causes phase noise (i.e., jitter) in the feedback clock signal FBCLK. For example, feedback clock signal FBCLK may have jitter of up to one cycle of output clock signal VCOCLK.

Figure 2:
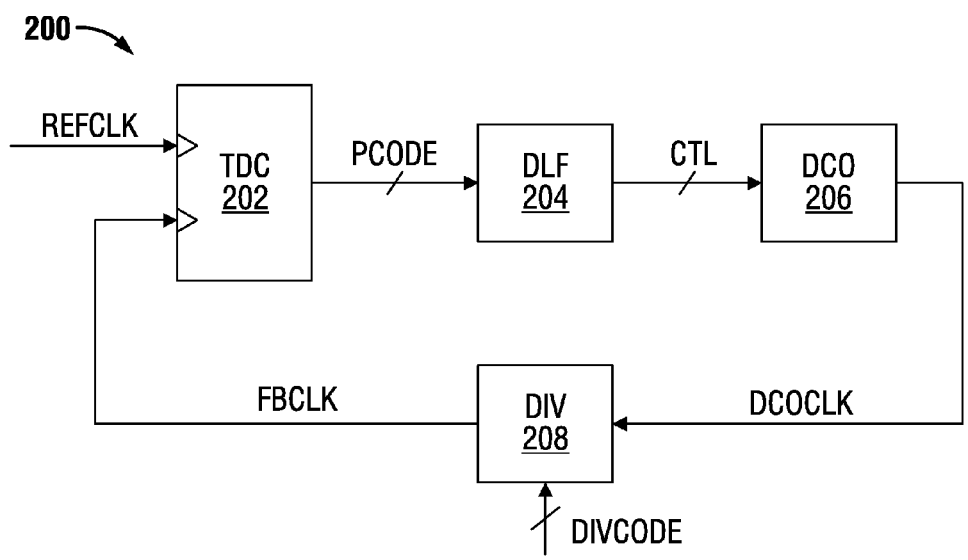
FIG. 2 illustrates a functional block diagram of a conventional digital phase-locked loop including a feedback frequency divider.

Referring to FIG. 2, exemplary digital phase-locked loop 200, includes time-to-digital converter 202, digital loop filter 204, and digitally-controlled oscillator 206. Time-to-digital converter 202 samples and digitizes phase error between reference clock signal REFCLK and feedback clock signal FBCLK to generate phase error code PCODE. Reference clock signal REFCLK may be provided by a fixed source, such as a crystal oscillator, a microelectromechanical structure (MEMS) oscillator, or other suitable source. Digital loop filter 204 filters phase error code PCODE and provides control code CTL to digitally-controlled oscillator 206 to adjust the frequency and phase of output clock signal DCOCLK to achieve phase lock to input clock signal REFCLK.

Reference clock signal REFCLK has frequency FREF that is multiplied based on divider code DIVCODE to generate output clock signal DCOCLK. Output clock signal DCOCLK has frequency FDCO, which can be determined by divider value DIVCODE of the feedback frequency divider in the phase-locked loop: FDCO=FREF×DIVCODE. Feedback frequency divider 208 may include a digital-to-time period converter that may be a fractional-N feedback frequency divider receiving output clock signal DCOCLK as its reference clock signal and divider value DIVCODE as a digital control word. Divider value DIVCODE may be a divide value sequence of integers corresponding to a target fractional divider ratio. In other embodiments, divider value DIVCODE is an integer divider value.

Figure 3:
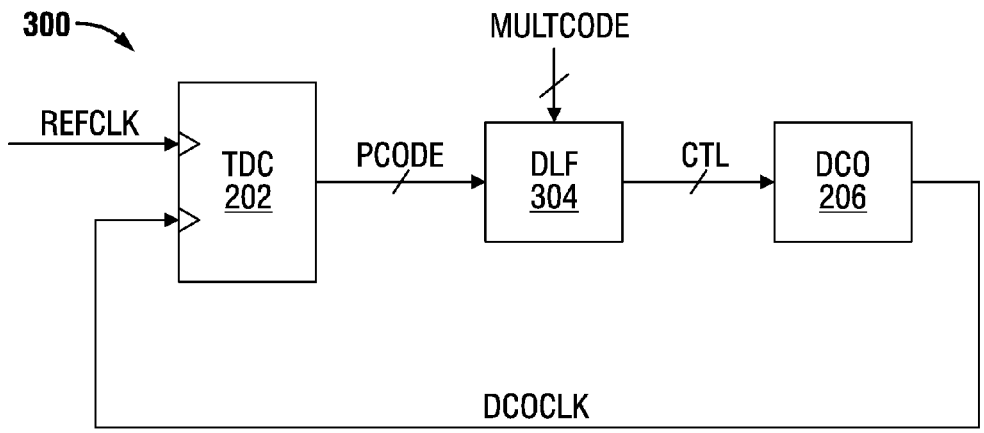
FIG. 3 illustrates a functional block diagram of a conventional digital frequency-locked loop integrating feedback frequency divider functionality in a time-to-digital converter and digital loop filter that determine a frequency ratio between the reference clock signal and the feedback clock signal.

Referring to FIG. 3, digital frequency-locked loop 300 integrates feedback frequency divider functionality into the forward path. For example, time-to-digital converter 202 and digital loop filter 304 absorbs the feedback frequency divider functionality using a frequency counter and a differencing operation. The frequency counter and differencing operation counts a number of cycles of output clock signal DCOCLK that occur between rising and falling edges of reference clock signal REFCLK and determines a frequency ratio of frequency FDCO to frequency FREF to establish a target frequency divide ratio. Phase error PCODE represents accumulated cycles of feedback clock signal DCOCLK and is updated on every rising or falling edge of reference clock signal REFCLK. Digital-loop filter 304 may apply a first-order difference to generate a frequency ratio that may be internally subtracted from a target frequency ratio code MULTCODE to generate a frequency error. Subsequent filtering of the frequency error generates control code CTL, which controls digitally-controlled oscillator 206 to lock the frequency of feedback clock signal DCOCLK to the frequency of reference clock signal REFCLK.

In any of the phase-locked loop topologies of FIGS. 1-3, low frequency noise may change the slicing point of an amplifier in the path of the reference clock signal, thereby causing duty cycle variations (i.e., amplitude noise). For example, a change in a slicing point of a crystal oscillator amplifier may result in rising edges that are transmitted to a phase-locked loop earlier in time and may result in falling edges that are transmitted later in time. Phase/frequency detector 102 and time-to-digital converter 202 sample differences between one edge (e.g., rising edge) of reference clock signal REFCLK and an edge (e.g., rising edge) of feedback clock signal VCOCLK or feedback clock signal DCOCLK, respectively, which relaxes duty cycle requirements of the corresponding feedback clock signal and reference clock signal REFCLK generated by the crystal oscillator. However, since phase-locked loop 100 and phase-locked loop 200 track only one edge, phase-locked loop 100 and phase-locked loop 200 up-convert the edge alignment variations of their respective inputs into phase noise, which causes jitter on the respective outputs of those phase-locked loops.

Figure 4:
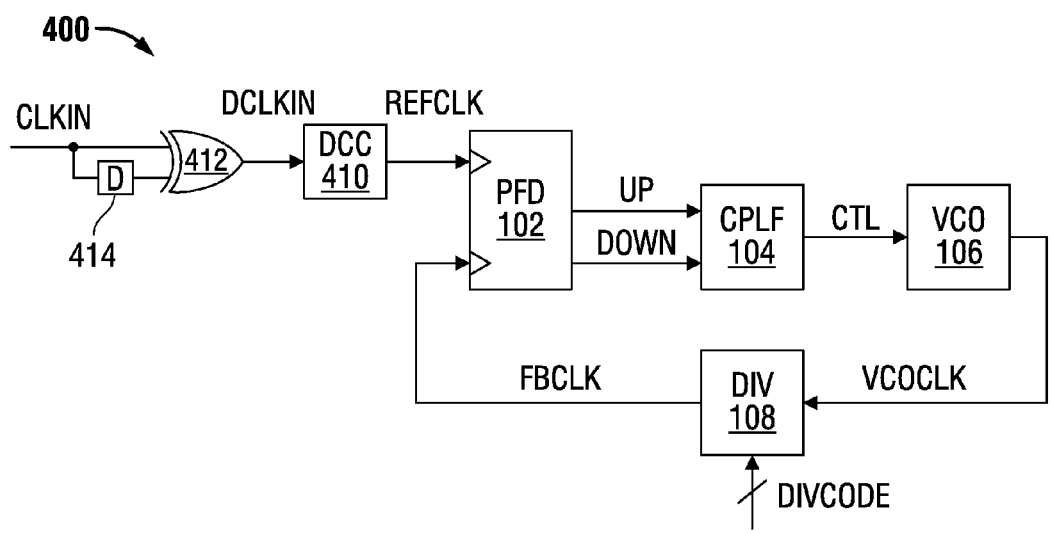
FIG. 4 illustrates a functional block diagram of a conventional analog phase-locked loop including frequency doubling of a reference clock signal.

Referring to FIG. 4, an exemplary frequency doubling technique doubles the input edge rate of the input signal, e.g., using delay element 414 and exclusive-or 412 or other frequency doubler circuit to generate a rising (or falling) edge on each transition of reference clock signal REFCLK. Frequency doubling increases the frequency of an input clock signal by a factor of two (i.e. rising and falling input clock edges produce pulses on the exclusive-or output) allowing the phase-locked loop to sample phase information at twice the rate compared to the rising (or falling) edge-only sampling used in conventional phase-locked loops. The frequency doubling technique facilitates lowering by a factor of two the clock multiplication required by the phase-locked loop and extends the permissible phase-locked loop bandwidth by this same factor. In addition, sampling the input phase error at twice the rate may provide a 3 dB improvement in noise. However, duty cycle error of the reference clock signal REFCLK causes deterministic jitter in doubled input clock DCLKIN, which may cause reference tone feed-through. Accordingly, duty cycle correction module 410 is included in this topology to suppress deterministic jitter of the signal provided to phase/frequency detector 102, and to suppress a resulting reference spur in the output clock signal VCOCLK. In addition, the phase-locked loop bandwidth may be reduced to a lower value to further suppress any deterministic jitter.

While the topology of FIG. 4 reduces or eliminates duty cycle error to address issues with deterministic jitter, such duty-cycle correction may increase phase noise in the signal path caused by the additional substantial delay required to correct the duty cycle. Also, since duty cycle correction circuits control rising and/or falling edge delays to correct duty cycle, those circuits may destroy the relationship of correlated noise that exists on the rising and falling edge of the frequency reference signal. That correlated noise may originate from, e.g., low frequency noise seen at a reference signal generator sine-to-square converter input which changes the slicing point of the input sine wave and, therefore, modulates the duty cycle seen at the output of the sine-to-square converter. If only one edge of the sine-to-square output is being sampled (as is typically the case with a conventional phase-locked loop) then this low frequency noise will be perceived as low frequency reference clock jitter and will degrade the close-in phase noise performance of the resulting phase-locked loop output clock. However, low frequency noise components (i.e., noise components having frequencies that are substantially less than frequency FREF of the reference clock signal (e.g., 0.1×FREF)) merely cause a change in slicing level that may push the rising edge forward in time by a particular amount and may pull the falling edge back in time by approximately the same amount.

A phase-locked loop topology that reduces or eliminates edge alignment error that causes up-converted low frequency phase noise and maintains an increase by a factor of two in phase error sample rate at the input of the phase-locked loop averages timing information from both rising and falling edges. The phase-locked loop topology detects the rising and falling edge of the reference clock signal and, using the information acquired by the phase-locked loop front end (e.g. phase/frequency detector and charge-pump loop filter), cancels or attenuates the reference tone feed-through by modulating the edge alignment of the feedback clock signal. The phase-locked loop technique has relatively low increase in integrated circuit area, power, and circuit complexity. In addition, the phase-locked loop technique suppresses unwanted reference tone feed-through that is introduced by conventional input clock signal frequency doubling techniques (e.g., exclusive-OR based input clock frequency doubling of FIG. 4).

Figure 5:
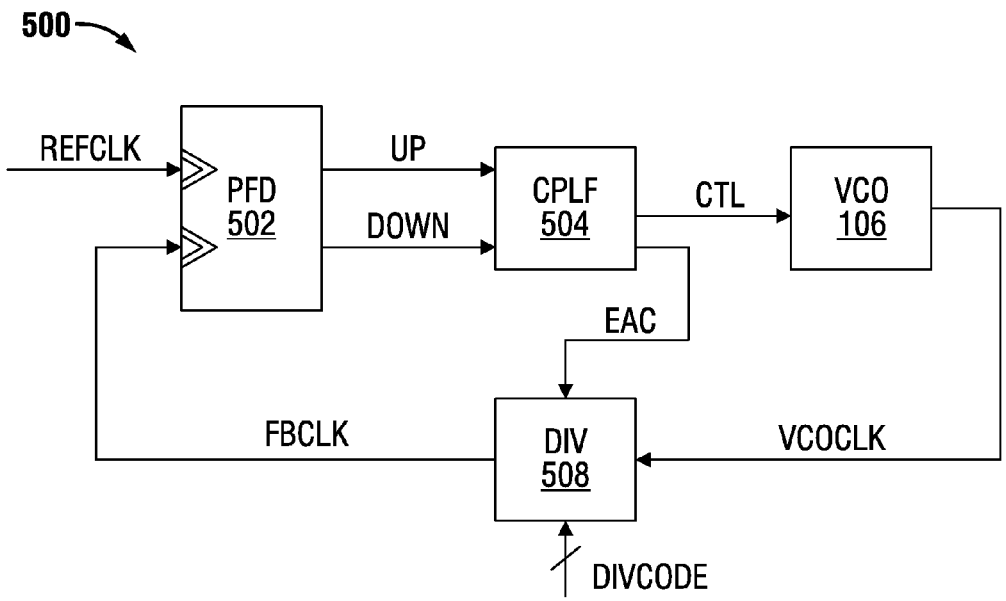
FIG. 5 illustrates a functional block diagram of an analog phase-locked loop using edge alignment correction and rising and falling edge detection of the reference clock signal using corresponding rising and falling edges of the feedback clock signal consistent with at least one embodiment of the invention.
Figure 6:
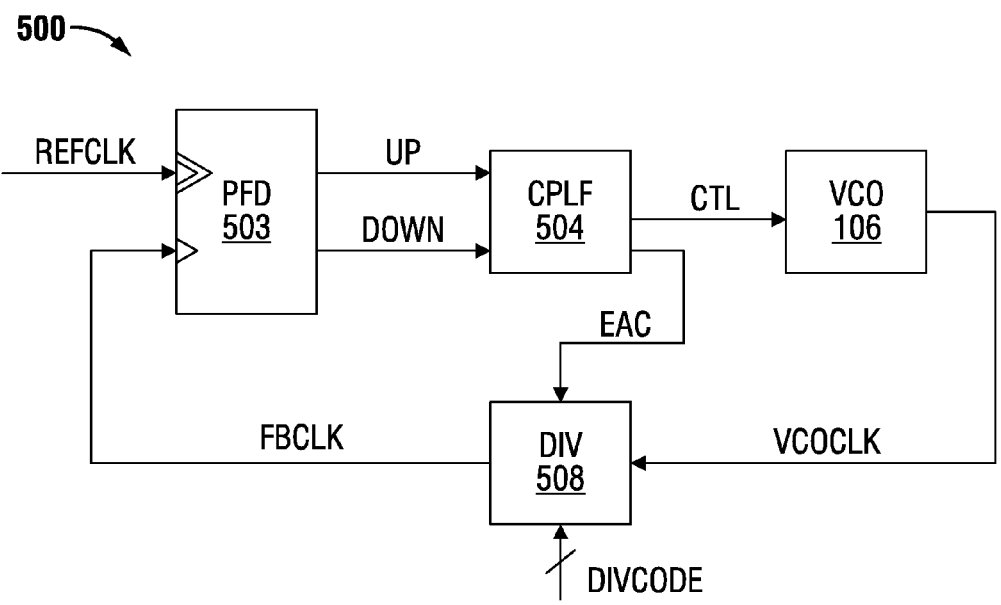
FIG. 6 illustrates a functional block diagram of an analog phase-locked loop using edge alignment correction and rising and falling edge detection of the reference clock signal using corresponding edges of the feedback clock signal consistent with at least one embodiment of the invention.

Referring to FIG. 5, analog phase-locked loop 500 includes phase/frequency detector 502 configured to detect rising edges and falling edges of reference clock signal REFCLK with respect to corresponding rising and falling edges of feedback clock FBCLK (as indicated by the nested triangle input ports). In at least one embodiment, the frequency of feedback clock signal FBCLK may be an integer multiple of N (e.g., N=1) of the frequency of reference clock signal REFCLK, and mixed-edge triggered phase/frequency detector 503 alternates between making phase error measurements of reference clock signal REFCLK rising edge and a corresponding rising edge of feedback clock signal FBCLK and phase error measurements of reference clock signal falling edge and a corresponding falling edge of the feedback clock signal (e.g., a first falling edge where N=1 or a subsequent falling edge where N is an odd integer greater than one). In at least one embodiment, phase/frequency detector 502 and charge pump/loop filter 504 are implemented using rising and falling edge bang-bang charge pump phase detectors and loop filters. In at least one embodiment, a single phase/frequency detection and charge pump circuit is used for input phase sampling of both rising and falling edges in alternating operations. Referring to FIG. 6, in at least one embodiment, analog phase-locked loop 500 includes mixed-edge-triggered phase/frequency detector 503, which does not count half cycles of feedback clock signal FBCLK, the frequency of feedback clock signal FBCLK may be an even integer multiple of N (e.g., N=2) of the frequency of reference clock signal REFCLK, and mixed-edge triggered phase/frequency detector 503 alternates between making phase error measurements of reference clock signal REFCLK rising edge and a first corresponding edge of feedback clock signal FBCLK (e.g., a rising edge) and phase error measurements of reference clock signal falling edge and a corresponding rising edge of the feedback clock signal (e.g., a next rising edge when N=2, or other rising edge subsequent to the next rising edge where N is an even integer greater than two).

Referring to FIGS. 5 and 6, feedback frequency divider 508 corrects the edge alignment of output clock signal VCOCLK using digital code DIVCODE, edge alignment correction signal EAC, or combination thereof, to match the edges of clock signal FBCLK to corresponding edges of reference clock signal REFCLK. Digital code DIVCODE may be used for a coarse edge alignment adjustment and edge alignment correction signal EAC may be used for a fine edge alignment adjustment, as described further below. In at least one embodiment of analog phase-locked loop 500, edge alignment correction signal EAC is quantized within feedback frequency divider 508 for fine digital control of the duty cycle. In at least one embodiment, feedback frequency divider 508 includes a digitally controlled delay cell (e.g. phase interpolator) for digital-based edge control.

Figure 7:
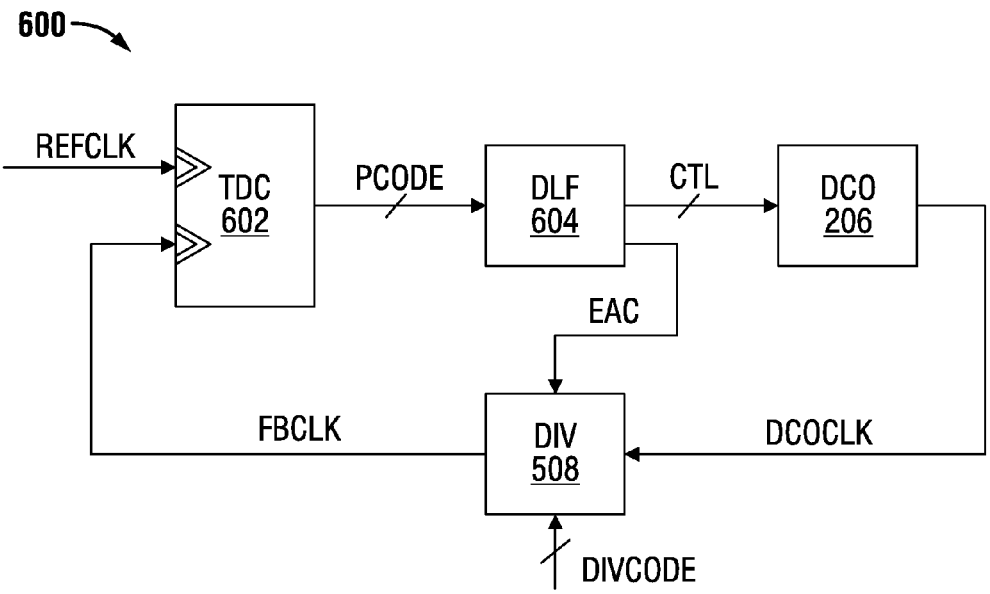
FIG. 7 illustrates a functional block diagram of a digital phase-locked loop using edge alignment correction and rising and falling edge detection of the reference clock signal using corresponding rising and falling edges of the feedback clock signal consistent with at least one embodiment of the invention.

Referring to FIG. 7, digital phase-locked loop 600 includes time-to-digital converter 602 configured to detect rising and falling edges of reference clock signal REFCLK with respect to corresponding rising and falling edges of feedback clock FBCLK (as indicated by the nested triangle input ports) and generates phase error PCODE representing a time error between edges of reference clock signal REFCLK and edges of feedback clock signal FBCLK and updates phase error code PCODE following detection of each rising edge error and each falling edge error. In at least one embodiment, the frequency of feedback clock signal FBCLK may be an integer multiple of N (e.g., N=1) of the frequency of reference clock signal REFCLK, and mixed-edge triggered time-to-digital converter 602 alternates between making measurements of reference clock signal REFCLK rising edge and a corresponding rising edge of feedback clock signal FBCLK and measurements of reference clock signal falling edge and a corresponding falling edge of the feedback clock signal (e.g., a first falling edge where N=1 or a subsequent falling edge where N is an odd integer greater than one). Although time-to-digital converter 602 may include duplicative time-to-digital converters, in at least one embodiment, a single time-to-digital converter circuit is used for input phase sampling of both rising edges and falling edges in alternating operations.

Figure 8:
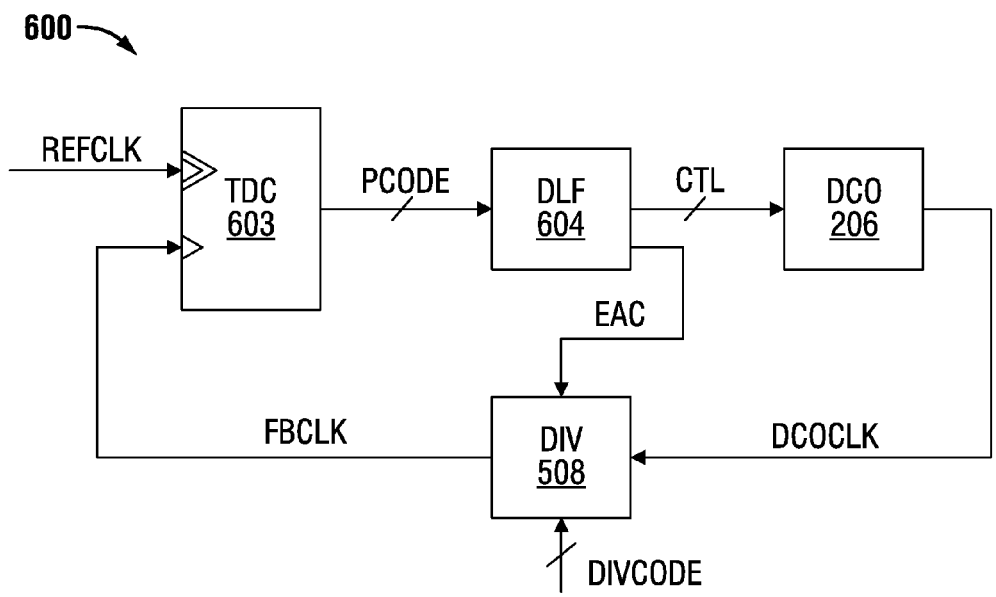
FIG. 8 illustrates a functional block diagram of a digital phase-locked loop using edge alignment correction and rising and falling edge detection of the reference clock signal using corresponding edges of the feedback clock signal consistent with at least one embodiment of the invention.

Referring to FIG. 8, in at least one embodiment, digital phase-locked loop 600 includes time-to-digital converter 603, which does not count half cycles of feedback clock signal FBCLK, the frequency of feedback clock signal FBCLK may be an even integer multiple of N (e.g., N=2) of the frequency of reference clock signal REFCLK, and time-to-digital converter 603 alternates between making measurements of reference clock signal REFCLK rising edge and a first corresponding edge of feedback clock signal FBCLK (e.g., a rising edge) and measurements of reference clock signal falling edge and a corresponding rising edge of the feedback clock signal (e.g., a next rising edge when N=2, or other rising edge subsequent to the next rising edge where N is an even integer greater than two).

Referring to FIGS. 7 and 8, feedback frequency divider 508 corrects the duty cycle of output clock signal DCOCLK using digital code DIVCODE, edge alignment correction signal EAC, or combination thereof, to match the edges of clock signal FBCLK to the corresponding edges of reference clock signal REFCLK. Digital code DIVCODE may be used for a coarse edge alignment adjustment and edge alignment correction signal EAC may be used for a fine duty cycle adjustment, as described further below. In at least one embodiment of digital phase-locked loop 600, edge alignment correction signal EAC is converted into an analog signal within feedback frequency divider 508 for fine control of the duty cycle.

Figure 9:
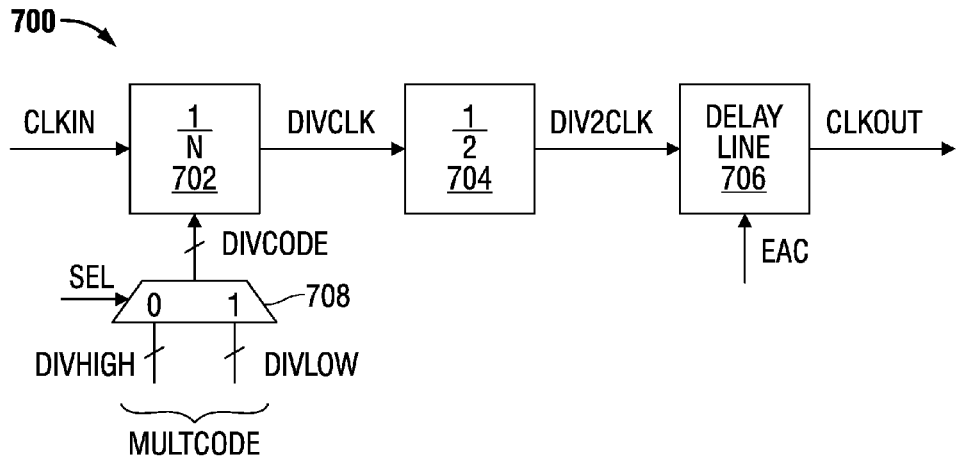
FIG. 9 illustrates a functional block diagram of an exemplary feedback frequency divider including edge alignment correction consistent with at least one embodiment of the invention.

In at least one embodiment of a phase-locked loop of FIGS. 5-8, the feedback frequency divider has a topology of feedback frequency divider 700 of FIG. 9. Divider circuit 702 performs a divide-by-N operation, where N is derived from divider code DIVCODE, which alternates between digital code DIVHIGH and digital code DIVLOW every period of reference clock signal REFCLK. Digital code DIVHIGH controls the number of periods of CLKIN that CLKOUT (which may be feedback clock FBCLK in FIGS. 5-8) is held high. Referring back to FIG. 9, digital code DIVLOW controls the number of periods of CLKIN that CLKOUT is held low. This technique may be used to coarsely adjust the duty cycle of CLKOUT to within one half of a period of CLKIN. Partitioning digital multiplier code MULTCODE into digital code DIVHIGH and digital code DIVLOW provides coarse edge alignment control and is determined during calibration. Digital code DIVHIGH and digital code DIVLOW may be determined based on edge alignment correction signal EAC during calibration or during steady-state operation and may be updated during steady-state operation. In at least one embodiment of feedback frequency divider 700, divider 704 is synchronously released from reset to provide appropriate high/low control. Controllable delay line 706 is responsive to edge alignment correction signal EAC. Edge alignment correction signal EAC may be an analog signal (e.g., a control voltage or control current) or a digital signal (e.g., a control code). In addition, edge alignment correction signal EAC may be converted between analog and digital signals for suitable control of delay line 706. In at least one embodiment of feedback frequency divider 700, the divide-by-two operation is not included. In at least one embodiment of a feedback frequency divider, functions of divider circuits 702 and 704 are integrated into a single divider circuit.

Figure 10:
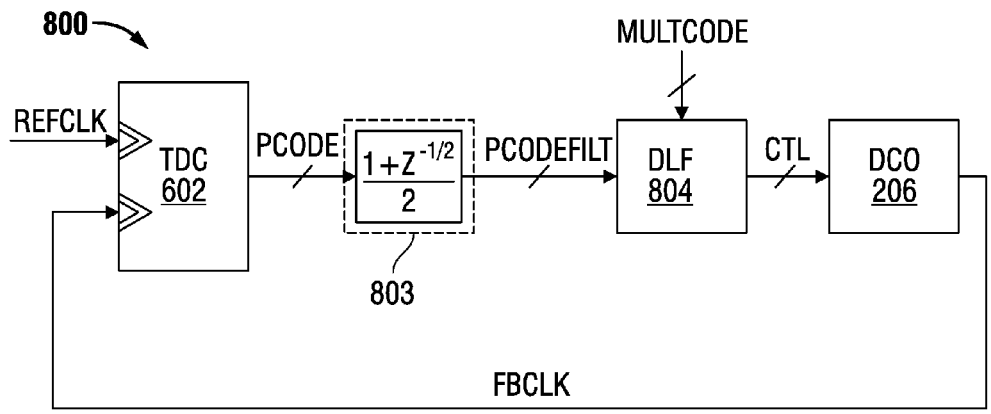
FIG. 10 illustrates a functional block diagram of a digital frequency-locked loop using rising and falling edge detection and edge alignment correction consistent with at least one embodiment of the invention.

Techniques described herein with reference to phase-locked loops may be utilized in other feedback control systems, e.g., frequency-locked loops. Referring to FIG. 10, in at least one embodiment, digital frequency-locked loop 800 includes time-to-digital converter 602, which samples feedback clock signal FBCLK generated by digitally-controlled oscillator 206 and generates phase error PCODE indicative of accumulated cycles of feedback clock signal FBCLK sampled at each rising and falling edge of reference clock signal REFCLK. Although time-to-digital converter 602 is illustrated as counting half cycles of feedback clock signal FBCLK (as indicated by the nested triangles on the input port receiving FBCLK), referring to FIG. 11, in at least one embodiment, digital frequency-locked loop 800 includes time-to-digital converter 603, which does not count half cycles of feedback clock signal FBCLK. Instead, the frequency of feedback clock signal FBCLK is an integer multiple of N (e.g., N=2) the frequency of reference clock signal REFCLK, and the time-to-digital converter 603 alternates between making phase error measurements of reference clock signal REFCLK rising edge and a first corresponding edge of feedback clock signal FBCLK (e.g., a rising edge) and phase error measurements of reference clock signal falling edge and a second corresponding edge of the feedback clock signal (e.g., a next rising edge when N=2). However, the embodiment of digital frequency-locked loop 800 that samples both rising and falling edges of feedback clock signal FBCLK may improve resolution of phase samples.

Figure 11:
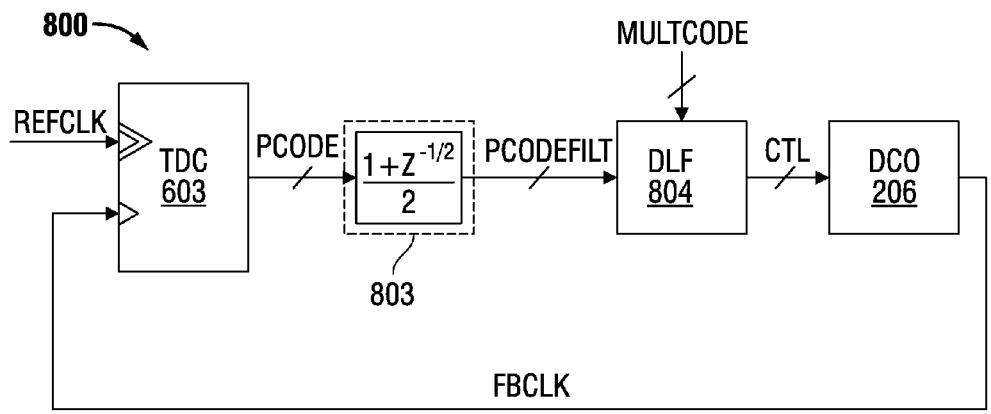
FIG. 11 illustrates a functional block diagram of a digital frequency-locked loop using rising and falling edge detection and edge alignment correction consistent with at least one embodiment of the invention.

Referring to FIGS. 10 and 11, time-to-digital converters 602 and 603 generate phase error PCODE representing accumulated cycles of feedback clock signal FBCLK updated on every rising edge and every falling edge of reference clock signal REFCLK. Notch filter 803 generates the average count of each adjacent rising sample and falling sample. Notch filter 803 removes any reference tone generated due to edge alignment error of reference clock signal REFCLK. In at least one embodiment, notch filter 803 is implemented using state elements updated responsive to (i.e., clocked by) reference clock signal REFCLK. Digital loop filter 804 low pass filters notch filter output signal PCODEFILT using digital code MULTCODE and provides digital control signal CTL to digitally-controlled oscillator 206. Digitally-controlled oscillator 206 adjusts the frequency and phase of output clock signal FBCLK to achieve frequency lock to input clock signal REFCLK. In at least one embodiment, digital loop filter 804 is implemented using state elements updated responsive to (i.e., clocked by) reference clock signal REFCLK. In at least one embodiment of digital frequency-locked loop 800, digital loop filter 804 and notch filter 803 may be integrated into a single filter structure.

Figure 12:
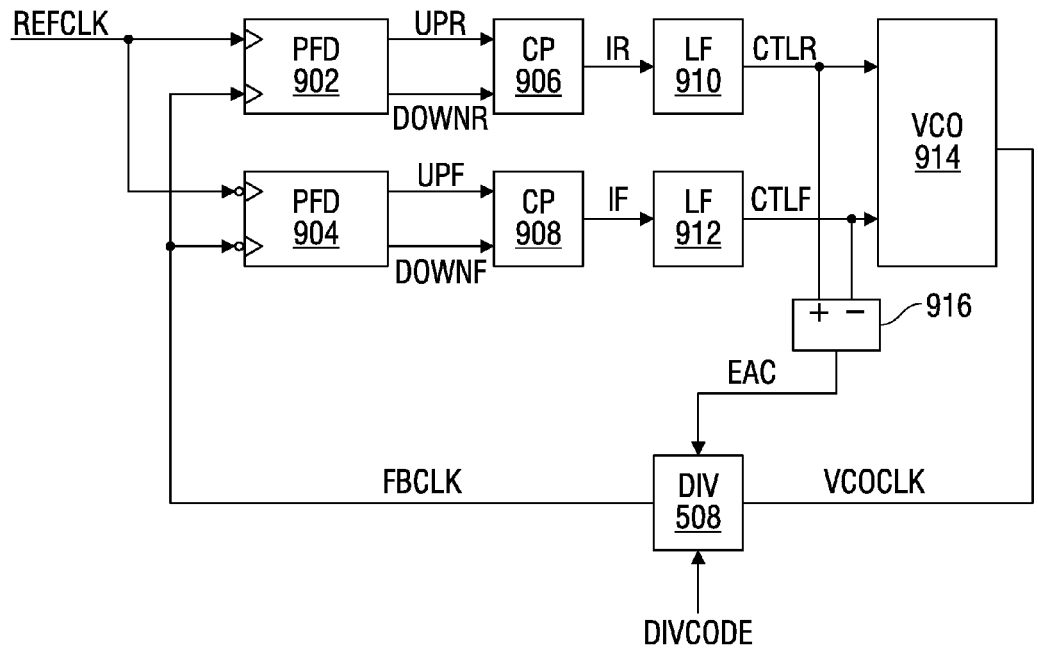
FIG. 12 illustrates a functional block diagram of an analog phase-locked loop using rising and falling edge detection of a reference clock signal and edge alignment correction consistent with at least one embodiment of the invention.

Referring to FIG. 12, in at least one embodiment, an analog phase-locked loop includes duplicative forward paths. One of the forward paths is responsive to reference clock signal REFCLK and feedback clock signal FBCLK received using inverted input ports. By using independent phase samplers (one for rising edges and one for falling edges) and splitting an analog varactor of a voltage-controlled oscillator into two equal paths, the phase-locked loop may sense the difference in control voltages generated, which indicates the edge alignment error between the reference clock signal REFCLK and feedback clock FBCLK. The phase-locked loop forces the phases of the reference clock signal REFCLK and feedback clock FBCLK to be equal using edge alignment correction signal EAC, e.g., to control delay cells in feedback frequency divider 508.

For example, phase/frequency detector 902 is responsive to input ports coupled to reference clock signal REFCLK and feedback clock signal FBCLK to detect rising edge phase error. Charge pump 906 and loop filter 910 generate rising edge control signal CTLR to adjust the frequency of voltage-controlled oscillator 914 to achieve phase lock to rising edges of input clock signal REFCLK. Phase/frequency detector 904 is responsive to inverted input ports coupled to reference clock signal REFCLK and feedback clock signal FBCLK to detect falling edge phase error. Charge pump 908 and loop filter 912 generate falling edge control signal CTLF to adjust the frequency of voltage-controlled oscillator 914 to achieve phase lock to falling edges of input clock signal REFCLK. Edge alignment correction circuit 916 generates an edge alignment correction signal EAC based on a difference between the rising edge phase error and the falling edge phase error and provides the correction signal to feedback frequency divider 508. Feedback frequency divider 508 corrects the edge alignment of feedback clock signal FBCLK using digital code DIVCODE, edge alignment correction signal EAC, or combination thereof, to match the edges of feedback clock signal FBCLK to the corresponding edges of reference clock signal REFCLK.

Figure 13:
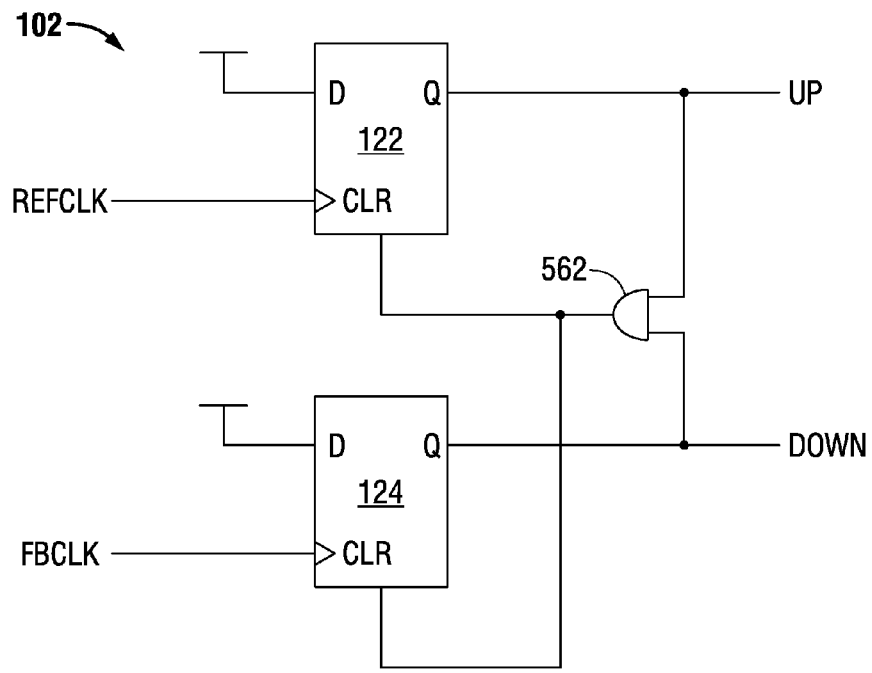
FIG. 13 illustrates a functional block diagram of an exemplary phase and frequency detector.

Referring to FIG. 13, conventional rising edge-triggered phase/frequency detector 102 includes flip-flop 122 responsive to a first input signal (e.g., reference clock signal REFCLK) and flip-flop 124 responsive to a second input signal (e.g., feedback clock FBCLK) to generate error signals UP and DOWN. Flip-flops 122 and 124 may be cleared using a signal generated by clear logic 562. Conventional rising edge-triggered phase/frequency detector 102 responds to rising edges. In steady-state, the first and second input signals have the same frequency.

Figure 14:
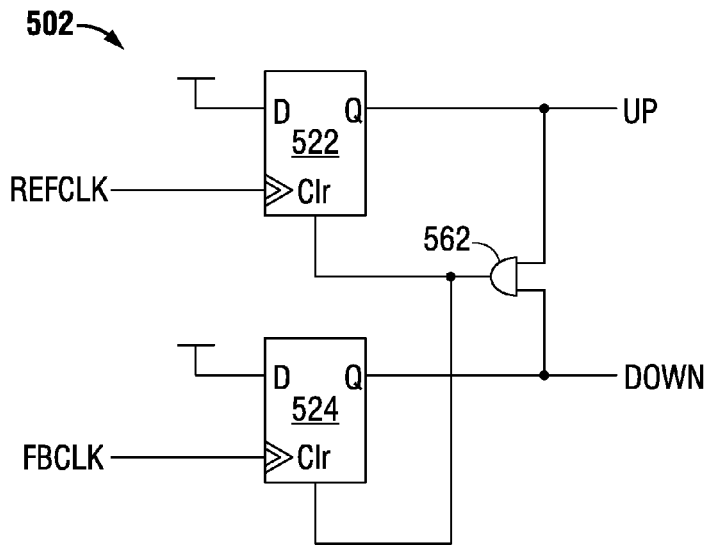
FIG. 14 illustrates a functional block diagram of an exemplary dual edge-triggered phase/frequency detector consistent with at least one embodiment of the invention.
Figure 15:
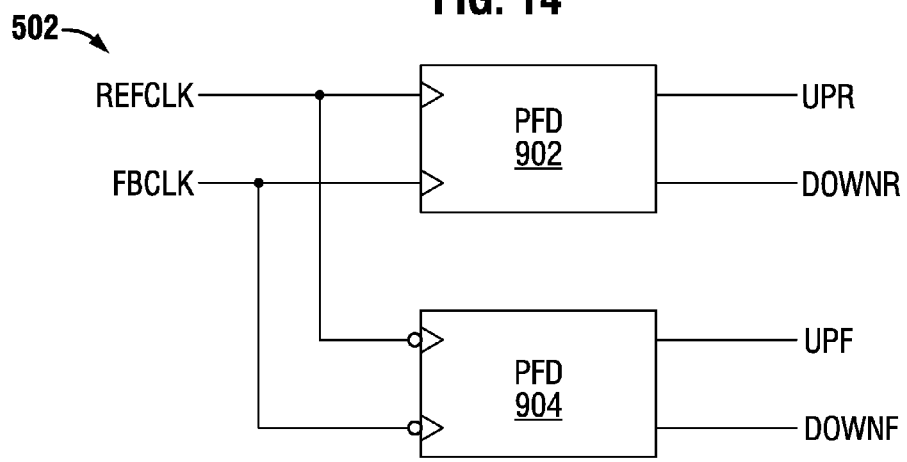
FIG. 15 illustrates a functional block diagram of an exemplary dual edge-triggered phase/frequency detector consistent with at least one embodiment of the invention.

Referring to FIG. 14, in at least one embodiment, dual-edge triggered phase/frequency detector 502 includes dual-edge-triggered flip-flop 522 responsive to a first input signal (e.g., reference clock signal RECFLK) and dual edge-triggered flip-flop 524 responsive to a second input signal (e.g., feedback clock FBCLK) to generate error signals UP and DOWN. In steady-state, the first and second input signals have the same frequency. Referring to FIG. 15, in another embodiment, dual-edge-triggered phase/frequency detector 502 includes single-edge-triggered phase/frequency detectors 902 and 904 to generate error signals UP and DOWN. Single-edge-triggered phase/frequency detectors 902 and 904 are effectively time-interleaved by providing phase/frequency detectors 904 with inputs complementary to corresponding inputs of phase/frequency detector 902.

Figure 16:
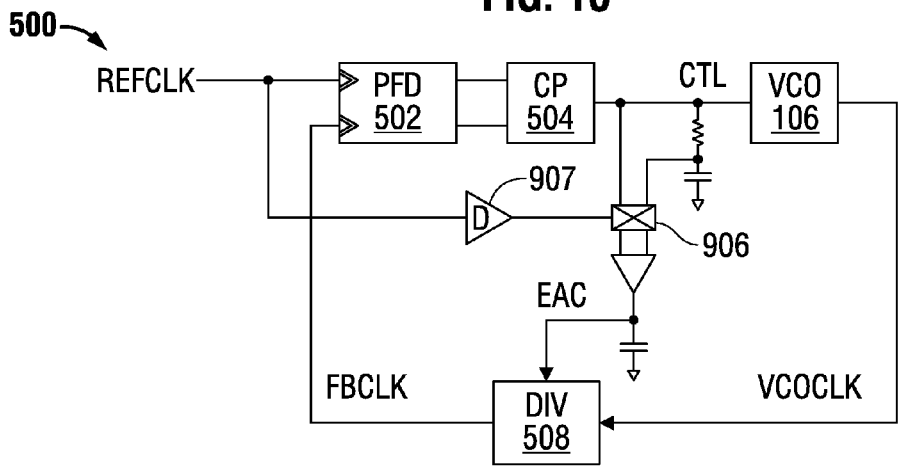
FIG. 16 illustrates a functional block diagram of an exemplary phase-locked loop including a dual edge-triggered phase/frequency detector and edge alignment correction consistent with at least one embodiment of the invention.

Referring to FIG. 16, exemplary analog phase-locked loop 500 includes dual-edge-triggered phase/frequency detector 502, which introduces an edge misalignment that causes a ripple in control signal CTL. For example, control signal CTL may include a magnitude spike in a first direction in response to detecting a rising edge and a magnitude spike in a second direction, opposing the first direction, in response to detecting a falling edge. Chopping circuit 906, which is responsive to a delayed version of the reference clock signal REFCLK, rectifies the ripple in control signal CTL and translates the ripple into an edge-alignment error signal EAC. Delay element 907 matches the delay through phase/frequency detector 502 and charge pump 504 so that chopping circuit 906 operates at appropriate instances.

Figure 17:
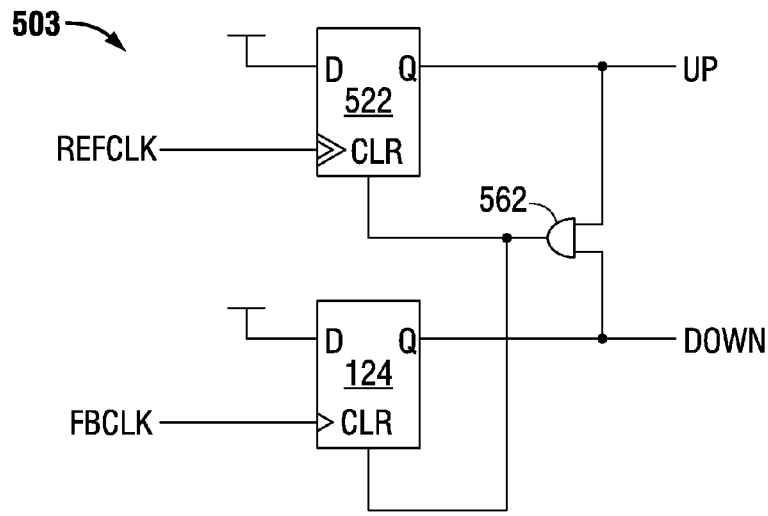
FIG. 17 illustrates a functional block diagram of an exemplary mixed edge-triggered phase/frequency detector consistent with at least one embodiment of the invention.
Figure 18:
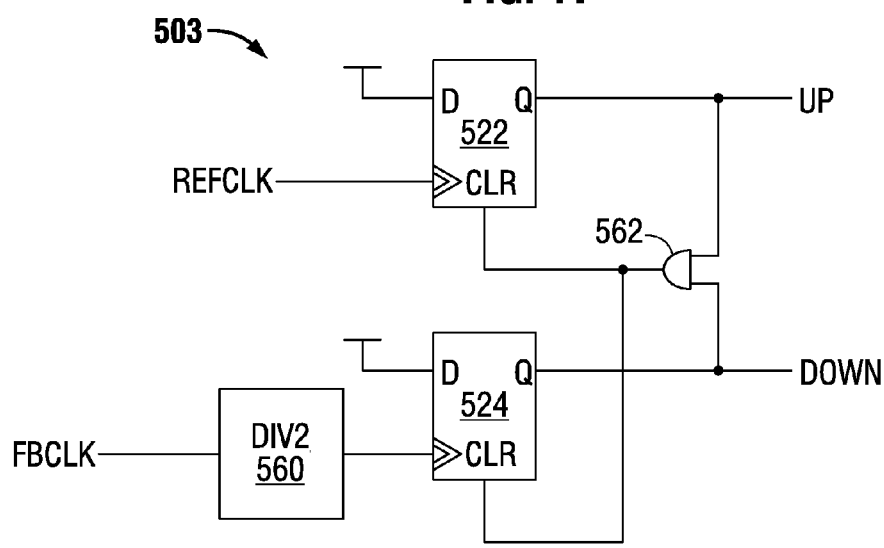
FIG. 18 illustrates a functional block diagram of an exemplary mixed edge-triggered phase/frequency detector consistent with at least one embodiment of the invention.

Referring back to FIG. 6, analog phase-locked loop 500 includes mixed-edge-triggered phase/frequency detector 503 that is responsive to rising and falling edges of a first input signal (e.g., reference clock signal REFCLK) and responsive to rising or falling edges of a second input signal (e.g., feedback clock signal FBCLK). Referring to FIG. 17, an exemplary embodiment of mixed-edge-triggered phase/frequency detector 503 includes dual-edge-triggered flip-flop 522 and single-edge-triggered flip-flop 124. Referring to FIG. 18, an exemplary embodiment of mixed-edge-triggered phase/frequency detector 503 includes a dual-edge-triggered phase/frequency detector including dual-edge-triggered flip-flops 522 and 524 and clock divider 560 providing the second input signal to a dual-edge-triggered flip-flop 524. In FIGS. 16 and 17, the frequency of feedback clock signal FBCLK is twice the frequency of reference clock signal REFCLK in steady state.

Figure 19:
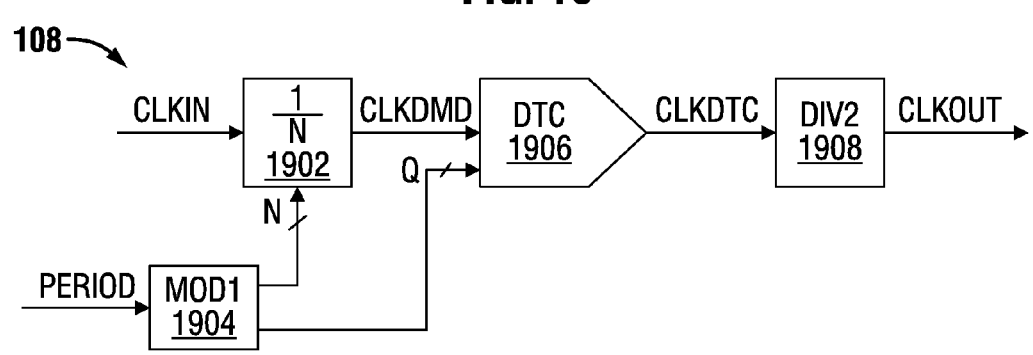
FIG. 19 illustrates a functional block diagram of a conventional interpolative divider.

Referring to FIGS. 1, 4, and 19, analog phase-locked loop 100 includes a conventional feedback frequency divider 108. Conventional feedback frequency divider 108 may include an interpolative divider including a fractional divider implemented using a digital first-order modulator 1904, which generates digital code N and digital code Q for fractional period multiplication defined by digital period signal PERIOD and is functionally equivalent to a frequency divider using digital period signal PERIOD as divider code DIVCODE. The average period of the output clock signal CLKOUT is the period of the input clock signal CLKIN multiplied by digital period signal PERIOD. Modulus divider 1902 generates a dithering modulo divider clock signal CLKDMD. Digital-to-time converter 1906 reduces quantization noise in dithering modulo divider clock signal CLKDMD using digital code Q to generate clock CLKDTC. Divider 1908 provides output clock signal CLKOUT.

Figure 20:
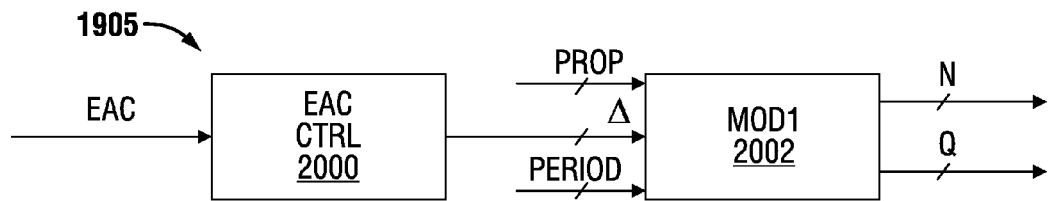
FIG. 20 illustrates a functional block diagram of an edge alignment correction and control for an interpolative divider consistent with at least one embodiment of the invention.

Referring back to FIGS. 5 and 6, analog phase-locked loop 500 may include feedback frequency divider 508 implemented as a digitally controlled fractional divider with digital-to-time converter (i.e., an interpolative divider). Rather than the digital first-order modulator 1904 of conventional feedback frequency divider 108 of FIG. 19, feedback frequency divider 508 of FIG. 5, 6, 7, or 8 may receive digital code N and digital code Q from digital first-order modulator 2002 of FIG. 20, which generates digital code N and digital code Q based on digital period signal PERIOD and digital edge alignment correction signal Δ received from edge alignment correction controller 2000. In addition, digital proportional control signal PROP may be used by digital first-order modulator 2002 to reduce noise. For an analog phase-locked loop implementation, edge alignment correction controller 2000 includes an analog-to-digital converter circuit that converts the edge alignment correction signal to a digital signal.

Figure 21:
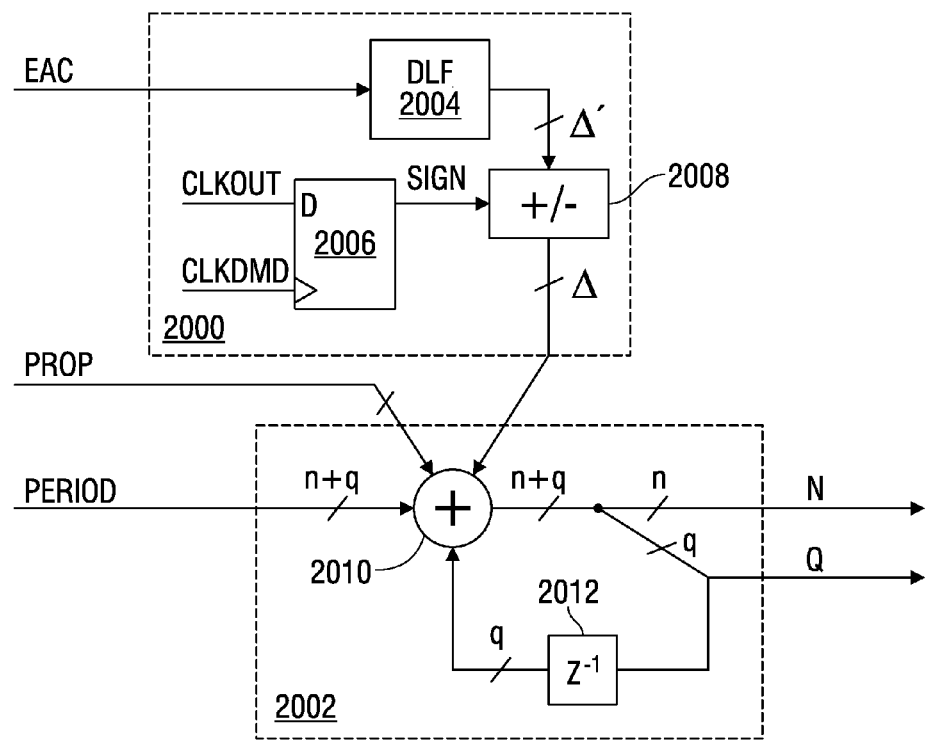
FIG. 21 illustrates a detailed functional block diagram of an exemplary edge alignment correction and control of FIG. 20 consistent with at least one embodiment of the invention.
Figure 22:
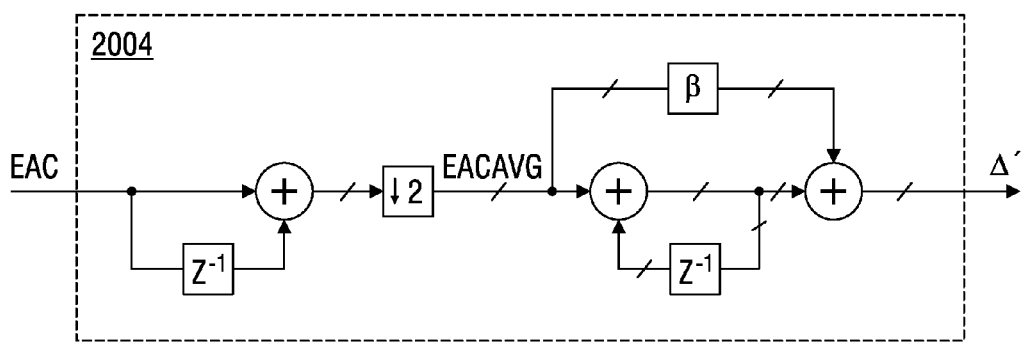
FIG. 22 illustrates a detailed functional block diagram of the digital loop filter of FIG. 21 consistent with at least one embodiment of the invention.

Exemplary implementations of edge alignment correction controller 2000 and digital first-order modulator 2002 are illustrated in FIG. 21. Edge alignment correction controller 2000 generates digital additive skew signal Δ' required for edge alignment correction using digital loop filter 2004, which is responsive to edge alignment correction signal EAC. Flip-flop 2006 generates control signal SIGN indicating the state of dithering modulo divider clock signal CLKDMD. Sign logic 2008 alternates sign at the rate of dithering modulo divider clock signal CLKDMD based on control signal SIGN to ensure orthogonality between edge alignment correction and a phase-locking technique in typical phase-locked loop operation. Digital first-order modulator 2002 includes a summing node that combines digital period signal PERIOD, digital proportional control signal PROP, and digital edge alignment correction signal Δ with digital feedback signal Q. In at least one embodiment, digital loop filter 2004 implements the filter structure of FIG. 22 to generate digital additive skew signal Δ' for proportional integral edge alignment correction loop control based on the edge alignment correction signal.

Thus, techniques for improving phase noise performance of the output clock signal of a phase-locked loop have been disclosed. While circuits and physical structures have been generally presumed in describing embodiments of the invention, it is well recognized that in modern semiconductor design and fabrication, physical structures and circuits may be embodied in computer-readable descriptive form suitable for use in subsequent design, simulation, test or fabrication stages. Structures and functionality presented as discrete components in the exemplary configurations may be implemented as a combined structure or component. Various embodiments of the invention are contemplated to include circuits, systems of circuits, related methods, and tangible computer-readable medium having encodings thereon (e.g., VHSIC Hardware Description Language (VHDL), Verilog, GDSII data, Electronic Design Interchange Format (EDIF), and/or Gerber file) of such circuits, systems, and methods, all as described herein, and as defined in the appended claims. In addition, the computer-readable media may store instructions as well as data that can be used to implement the invention. The instructions/data may be related to hardware, software, firmware or combinations thereof.

The description of the invention set forth herein is illustrative, and is not intended to limit the scope of the invention as set forth in the following claims. For example, while the invention has been described in embodiments of feedback control systems in which control signals are provided to a feedback frequency divider circuit, one of skill in the art will appreciate that the teachings herein can be utilized within other embodiments of feedback control systems that provide analog and/or digital control signal(s) to control edge alignment in charge pump circuits. In addition, the phase-locked loops and techniques described herein may be adapted to frequency-locked loops using a time-to-digital converter that includes a noise-shaping time-to-digital converter configured as a fine range, i.e., sub-ranging, time-to-digital converter. An exemplary time-to-digital converter that may be used to implement the frequency locked loop consistent with teachings described herein is described in U.S. patent application Ser. No. 14/817,129, entitled "Noise-Shaping Time-to-Digital Converter," naming Aaron J. Caffee, Brian G. Drost, and James F. Parker as inventors, filed Aug. 3, 2015, which application is incorporated herein by reference. Variations and modifications of the embodiments disclosed herein, may be made based on the description set forth herein, without departing from the scope and spirit of the invention as set forth in the following claims.

What is claimed is:

1. A feedback control system comprising:
   a controllable oscillator configured to generate an output clock signal based on at least one control signal generated using at least one error signal; and
   an error detector configured to generate the at least one error signal based on a rising edge difference between a rising edge of an input clock signal and a first corresponding edge of an edge alignment corrected feedback clock signal and further based on a falling edge difference between a falling edge of the input clock signal and a second corresponding edge of the edge alignment corrected feedback clock signal,
   wherein the edge alignment corrected feedback clock signal is at least partially based on the output clock signal.

2. The feedback control system, as recited in claim 1, wherein the feedback control system is a phase-locked loop, the feedback control system further comprising:
   a feedback frequency divider circuit configured to generate the edge alignment corrected feedback clock signal based on the output clock signal, a divider code, and an edge alignment correction signal.

3. The feedback control system, as recited in claim 2, wherein the divider code is used to provide a coarse edge alignment correction and the edge alignment correction signal is used to provide a fine edge alignment correction.

4. The feedback control system, as recited in claim 2, further comprising:
   at least one loop filter configured to generate the edge alignment correction signal based on the at least one error signal.

5. The feedback control system, as recited in claim 2, wherein the feedback frequency divider circuit comprises:
   a first frequency divider circuit responsive to a selected divider code;
   a second frequency divider circuit cascaded with the first frequency divider circuit, the second frequency divider circuit configured to divide a clock period by two, one of the first and second frequency divider circuits being configured to receive the output clock signal and the other of the first and second frequency divider circuits being configured to provide a divided clock signal; and
   a controllable delay line responsive to the edge alignment correction signal and the divided clock signal to generate the edge alignment corrected feedback clock signal.

6. The feedback control system, as recited in claim 1, wherein the error detector comprises:
   a first phase and frequency detector configured to generate a first control signal of the at least one control signal based on the rising edge difference; and
   a second phase and frequency detector configured to generate a second control signal of the at least one control signal based on the falling edge difference.

7. The feedback control system, as recited in claim 6, further comprising:
   a first charge pump configured to generate a first current indicative of the rising edge difference; and
   a second charge pump configured to generate a second current indicative of the falling edge difference.

8. The feedback control system, as recited in claim 7, further comprising:
   a first loop filter configured to generate the first control signal based on the first current; and
   a second loop filter configured to generate the second control signal based on the second current,
   wherein the controllable oscillator generates the output clock signal based on the first and second control signals.

9. The feedback control system, as recited in claim 8, further comprising:
   a difference circuit configured to generate an edge alignment correction signal based on a difference between the first control signal and the second control signal, wherein the edge alignment corrected feedback clock signal is further based on the edge alignment correction signal.

10. The feedback control system, as recited in claim 1, wherein the feedback control system is a digital frequency-locked loop, the feedback control system further comprising:
    a notch filter configured to attenuate a reference tone in the at least one error signal; and
    a loop filter configured to generate the at least one control signal based on an output of the notch filter.

11. The feedback control system, as recited in claim 10, wherein the error detector comprises:
    a time-to-digital converter configured to generate a digital phase error code as the at least one error signal.

12. A method comprising:
    sampling rising edge input error between a rising edge of a reference clock signal and a first corresponding edge of an edge alignment corrected feedback clock signal;
    sampling falling edge input error between a falling edge of the reference clock signal and a second corresponding edge of the edge alignment corrected feedback clock signal; and
    generating the edge alignment corrected feedback clock signal based on the rising edge input error, the falling edge input error, and a digital code.

13. The method, as recited in claim 12, wherein generating the edge alignment corrected feedback clock signal comprises:
    averaging the rising edge input error and the falling edge input error to thereby reduce amplitude noise in the edge alignment corrected feedback clock signal.

14. The method, as recited in claim 12, wherein generating the edge alignment corrected feedback clock signal comprises:

generating a digital phase error code indicative of the rising edge input error and the falling edge input error;

notch filtering the digital phase error code to generate an edge alignment corrected phase error code; and generating a control signal based on the edge alignment corrected phase error code.

15. The method, as recited in claim 14, further comprising:

generating an output clock signal using the control signal; and providing the output clock signal as the edge alignment corrected feedback clock signal.

16. The method, as recited in claim 12, wherein generating the edge alignment corrected feedback clock signal comprises:

generating at least one error signal based on the rising edge input error and the falling edge input error; and generating an edge alignment correction signal based on the at least one error signal, wherein the edge alignment corrected feedback clock signal is generated based on the edge alignment correction signal.

17. The method, as recited in claim 12, wherein generating the edge alignment corrected feedback clock signal comprises:

generating a divided output clock signal based on an output clock signal and a divider value; and delaying the divided output clock signal according to an edge alignment correction signal to generate the edge alignment corrected feedback clock signal.

18. The method, as recited in claim 17, wherein the divider value is used to provide a coarse edge alignment correction and the edge alignment correction signal is used to provide a fine edge alignment correction.

19. The method, as recited in claim 17, wherein generating the divided output clock signal comprises:

dividing a period of the output clock signal by a predetermined divider value and by an additional factor of two.

20. An apparatus comprising:

means for sampling rising edge input error between a rising edge of a reference clock signal and a first corresponding edge of an edge alignment corrected feedback clock signal and for sampling falling edge input error between a falling edge of the reference clock signal and a second corresponding edge of the edge alignment corrected feedback clock signal; and means for generating the edge alignment corrected feedback clock signal based on the rising edge input error and the falling edge input error.

* * * * *